(12) United States Patent
Hashimoto et al.

(10) Patent No.: US 6,770,210 B2
(45) Date of Patent: Aug. 3, 2004

(54) MAGNETORESISTANCE EFFECT ELEMENT AND METHOD FOR PRODUCING SAME

(75) Inventors: Susumu Hashimoto, Tokyo (JP); Yuichi Ohsawa, Tokyo (JP); Michiko Hara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/059,198

(22) Filed: Jan. 31, 2002

(65) Prior Publication Data

US 2002/0101328 A1 Aug. 1, 2002

(30) Foreign Application Priority Data

Feb. 1, 2001 (JP) ........................................ 2001-026028

(51) Int. Cl.⁷ .......................... G44C 1/22; G11B 5/127; H04R 31/00
(52) U.S. Cl. ...................... 216/22; 29/603.07
(58) Field of Search .......................... 216/22; 29/603.14, 29/603.15, 603.17, 603.18, 603.07, 603.12; 438/63, 655, 689; 338/32 R; 360/318.1, 313, 322; 204/192.1; 430/311, 312, 319

(56) References Cited

U.S. PATENT DOCUMENTS 6,564,445 B1 * 5/2003 Hashimoto et al. ...... 29/603.14

* cited by examiner

Primary Examiner—Gregory Mills
Assistant Examiner—Roberts Culbert
(74) Attorney, Agent, or Firm—Oblon, Spivak, McClelland, Maier & Neustadt, P.C.

(57) ABSTRACT

There is provided a magnetoresistance effect element which is capable of causing a large sense current to flow between electrodes and which has a smaller dispersion in direction of magnetization of a CPP element based on a magnetic field due to the sense current and has a lager reproducing output, and a method for producing the same. The magnetoresistance effect element is produced by: after forming a first electrode, forming a magnetoresistance effect film on the first electrode; applying a self-condensing organic resist on the magnetoresistance effect film, and thereafter, causing the organic resist to be droplets; subsequently, forming an insulating film thereon, and thereafter, removing the organic resist to form a groove portion in the insulating film to expose the top surface of the magnetoresistance effect film; and filling the groove portion with an electrode material to form a second electrode.

10 Claims, 9 Drawing Sheets

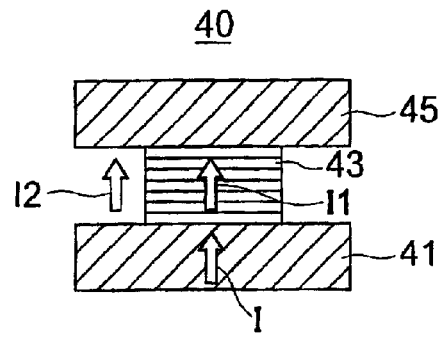
FIG. 5
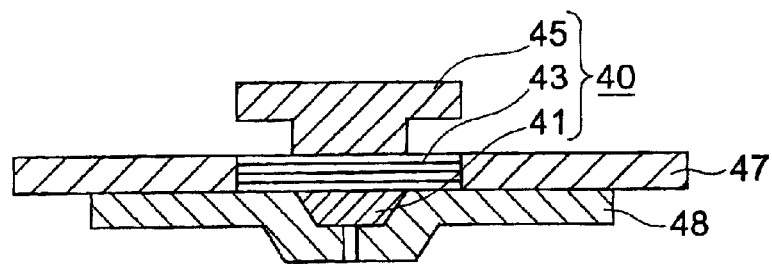
FIG. 6
| | SENSE CURRENT (mA) | ELEMENT SIZE (μm) | MAGNETIC FIELD DUE TO CURRENT(Oe) |
|---|---|---|---|
| TMR ELEMENT | 10 | 1 | 1 |
| CPP ELEMENT | 100 | 0.2 | 50~100 |
FIG. 7

MAGNETORESISTANCE EFFECT ELEMENT AND METHOD FOR PRODUCING SAME

CROSS REFERENCE TO RELATED APPLICATION

This application is based upon and claims the benefit of priority from the prior Japanese Patent Applications No. 2001-26028, filed on Feb. 1, 2001; the entire contents of which are incorporated herein by reference.

BACKGROUND OF THE INVENTION

1. Field of the Invention

The present invention generally relates to a magnetoresistance effect element and a method for producing the same.

2. Description of Related Art

In recent years, the density of information recorded in a magnetic recording medium has been increased. In HDD (Hard Disk Drive) units, a system having a high packing density of 10 Gbpsi (Gigabit per square inch) has been put to practical use, and a system having a higher packing density has been required. As a countermeasure thereto, it is important to form a narrow track having a width of 1 $\mu$m in a magnetic head. Also in a recording and/or reproducing thin-film magnetic head, various proposals for structure have been made in order to achieve a narrow track. However, it is said that a magnetic packing density capable of being applied to the structure of a conventionally proposed recording and/or reproducing thin-film magnetic head is limited to about 100 to 200 Gbpsi. In order to further increase the magnetic packing density, it is required to provide a magnetic gap having a size of 0.1 $\mu$m or less and a high reproducing output. However, it is very difficult to realize such a magnetic gap and a high reproducing output in a conventionally proposed recording and/or reproducing thin-film magnetic head.

Therefore, in order to solve these problems, a horizontal thin-film magnetic head and a CPP (Current Perpendicular to the Plane) type magnetoresistance effect film material having a large magnetoresistance effect have been proposed in Japanese Patent Laid-Open Nos. 11-120509 and 11-25433 and Outline of 24-th Lecture of Japan Applied Magnetism Institution (2000), page 427.

FIG. 5 is a schematic diagram most simply showing a CPP type magnetoresistance effect element (which will be also hereinafter referred to as a CPP element). That is, this CPP element 40 has a structure wherein a bottom electrode 41 and a top electrode 45 are formed on the top and bottom of a CPP type magnetoresistance effect film 43, an insulator (not shown) being formed around the bottom and top electrodes 41 and 45. Because of such a structure, a reproducing current I caused to flow through the bottom electrode 41 is separated into a current I1 flowing through the CPP type magnetoresistance effect film 43 and a leakage current I2 flowing between the top and bottom electrodes 41 and 45 to flow into the top electrode 45. At this time, with respect to the output of the CPP type magnetoresistance effect film 43, only a variation in resistance due to the current I1 is detected as a variation in voltage.

In the thin-film magnetic head using the CPP element 40 wherein a current is applied in a direction perpendicular to the plane of the film, the thickness of the insulator decreases as the thickness of the reproducing element (CPP element) decreases. In accordance therewith, the distance between the electrodes 41 and 45 for sandwiching the reproducing element therebetween decreases, and the possibility of increasing a leakage current flowing through the insulator other than a current flowing through the reproducing element increases. Therefore, in order to solve such a problem, it is required to develop a CPP type magnetoresistance effect film material capable of obtaining a high reproducing output with a small current and an insulating material having a high withstand voltage. However, it is not easy to achieve the purposes therefor.

FIG. 6 shows the cross-sectional structure of an actual reproducing magnetic head when the CPP element 40 is applied to the head. In the construction of the reproducing magnetic head, magnetization information is sucked up from a medium (not shown) by a reproducing magnetic yoke 48 to be propagated to the CPP element 40, and the resistance changes by the change in direction of magnetization at that time. In FIG. 6, a magnetization fixing layer 47 is formed on the side portion of the CPP type magnetoresistance effect film 43. Also in this case, in FIG. 6, when a reproducing current is caused to flow, the direction of magnetization of the CPP element 40 fluctuates by a magnetic field due to current from a corner portion of the top electrode 45, so that it is not possible to obtain a high reproducing output.

On the other hand, as a magnetoresistance effect element using the same principle as that of the CPP element, there is a TMR (Tunneling Magneto-Resistance) element. In the case of the TMR element, an insulator of $Al_2O_3$ or the like is used as a junction. Since this insulator has a very small thickness of about 1 nm, it is not required to cause a sense current, which flows through the TMR element, to be larger than that of the CPP element, and it is not required to increase the withstand voltage of a surrounding insulator in the TMR element.

On the other hand, it is required to cause a large sense current to flow through the CPP element 40 in order to obtain a high reproducing output. In this case, the magnetic field due to sense current is very large to disturb the direction of magnetization of the magnetization fixing layer 47 and to form the CPP type magnetoresistance effect film 43. Since the direction of magnetization of a magneto-sensitive layer having magnetization disperses, there is a problem in that the detection sensitivity greatly decreases. As an example, the relationship between the sense currents of a TMC element and CPP element and the magnetic fields due to the currents is shown in FIG. 7. As shown in FIG. 7, in order to obtain a necessary and sufficient reproducing output, the sense current of the CPP element must be about ten times as large as that of the TMR element. In accordance therewith, the magnetic field due to current, which is applied to the CPP element and which is produced in the vicinity of the CPP element is a very large magnetic field of 50 to 1000 times as large as that of the TMR element.

SUMMARY OF THE INVENTION

It is therefore an object of the present invention to eliminate the aforementioned problems and to provide a magnetoresistance effect element which is capable of causing a large sense current to flow between electrodes and which has a smaller dispersion in direction of magnetization of a CPP element based on a magnetic field due to the sense current and has a lager reproducing output, and a method for producing the same.

In order to accomplish the aforementioned and other objects, according to a first aspect of the present invention, there is provided a method for producing a magnetoresistance effect element comprising: after forming a first electrode, forming a magnetoresistance effect film on the first electrode; applying a self-condensing organic resist on the magnetoresistance effect film, and thereafter, causing the organic resist to be droplets; subsequently, forming an insulating film thereon, and thereafter, removing the organic resist to form a groove portion in the insulating film to expose the top surface of the magnetoresistance effect film; and filling the groove portion with an electrode material to form a second electrode.

According to such a method for producing magnetoresistance effect according to the first aspect of the present invention, the groove portion formed in the insulating film leaves the magnetoresistance effect film as approaching the periphery of the magnetoresistance effect film, so that the distance between the first and second electrodes increases as approaching the periphery of the magnetoresistance effect film. Thus, even if a large current is caused to flow between the first and second electrodes, it is possible to prevent the direction of magnetization of a magnetization fixing film, which is formed on the side portion of the magnetoresistance effect film, from being disturbed by a magnetic field due to the current, and it is possible to decrease the dispersion in direction of magnetization of the magnetoresistance effect film. In addition, it is possible to decrease a leakage current from the corner portions of the first and second electrodes, so that it is possible to cause a large sense current to flow between the electrodes and obtain a high reproducing output.

Furthermore, for example, the magnetoresistance effect films according to the present invention include giant magnetoresistance effect films and tunneling magnetoresistance effect films which have a ferromagnetic layer, a non-magnetic layer and a ferromagnetic layer and wherein the electric resistance of the whole magnetoresistance effect film varies in accordance with the variation in relative direction of magnetization of the ferromagnetic layers facing each other via the non-magnetic layer. If the non-magnetic layer is a conductive non-magnetic layer of Cu or the like, the magnetoresistance effect film can be widely used as a current perpendicular to the plane type giant magnetoresistance film for a magnetic storage, a magnetoresistance effect head, a magnetic sensor or the like. If the non-magnetic layer contains a dielectric, such as alumina or an oxide film, a tunneling current flows between both ferromagnetic layers via the dielectric, so that the magnetoresistance effect can be widely used as a tunneling magnetoresistance effect film for a magnetic storage, a magnetic head, a magnetic sensor or the like.

According to a second aspect of the present invention, there is provided a method for producing a magnetoresistance effect element comprising: after forming a first electrode, forming a magnetoresistance effect film on the first electrode; forming an insulating film on the magnetoresistance effect film; and using a mask having an opening portion, the position of which matches with the position of the magnetoresistance effect film, to isotropic-etch the insulating film to form a curved recessed portion in the insulating film to expose the top surface of the magnetoresistance effect film to form a second electrode in the recessed portion.

According to such a method for producing magnetoresistance effect according to the first aspect of the present invention, the mask having the opening portion, the position of which matches with the position of the magnetoresistance effect film, is used for isotropic-etching the insulating film formed on the magnetoresistance effect film, so that the curved recessed portion is formed in the insulating film to form the second electrode in the recessed portion. Therefore, the positioning accuracy of the magnetoresistance effect film to the second electrode is improved, and the second electrode having a good shape converging toward the magnetoresistance effect film is obtained, so that the distance between the first and second electrodes increases as approaching the periphery of the magnetoresistance effect film. Thus, even if a large current is caused to flow between the first and second electrodes, it is possible to prevent the direction of magnetization of a magnetization fixing film, which is formed on the side portion of the magnetoresistance effect film, from being disturbed by a magnetic field due to the current, and it is possible to decrease the dispersion in direction of magnetization of the magnetoresistance effect film. In addition, it is possible to decrease a leakage current from the corner portions of the first and second electrodes, so that it is possible to cause a large sense current to flow between the electrodes and obtain a high reproducing output.

Furthermore, the second electrode is preferably formed by forming a converging opening portion, which is communicated with the magnetoresistance effect film, in the insulating film by an anisotropic etching after forming a curved recessed portion, and by filling the opening portion and the recessed portion with an electrode material film.

Thus, since the converging opening portion communicated with the magnetoresistance effect film is formed in the insulating film by the anisotropic etching, the second electrode further converges toward the magnetoresistance effect film, so that it is possible to cause a larger sense current to flow between the electrodes and obtain a larger reproducing output.

According to a third aspect of the present invention, there is provided a magnetoresistance effect element comprising: a first electrode which has a first protruding portion having a substantially flat top face; a current perpendicular to the plane type magnetoresistance effect film, one end of which is electrically connected to the top face of said first electrode; and a second electrode which has a second protruding portion having a substantially flat top face, the second protruding portion being electrically connected to the other end of the magnetoresistance effect film, wherein the first and second protruding portions have shapes converging toward the magnetoresistance effect film in a cross section perpendicular to the film plane of the magnetoresistance effect film.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings:

FIG. 5 is a sectional view showing the construction of a CPP type magnetoresistance effect element;

FIG. 6 is a sectional view showing the construction of a current perpendicular to the plane type thin-film magnetic head;

FIG. 7 is a table showing the relationship between the sense currents of a TMR element and CPP element and the magnetic field due to the currents;

DESCRIPTION OF THE EMBODIMENTS

Referring now to the accompanying drawings, the embodiments of a method for producing a magnetoresistance effect element according to the present invention will be described below.

(First Embodiment)

Figure 1:
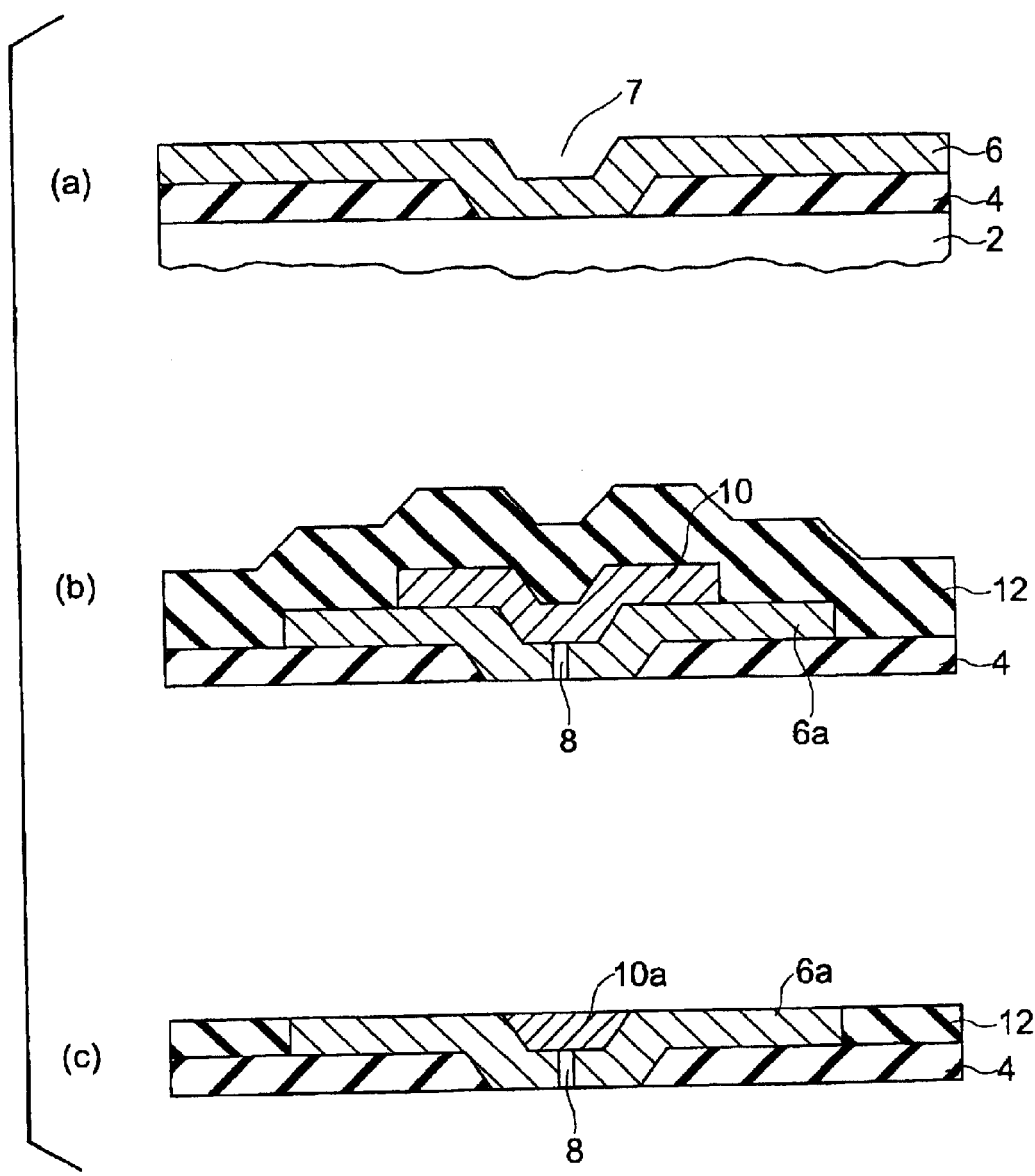
FIGS. 1(a) through 1(c) are sectional views showing producing steps in the first embodiment of a method for producing a magnetoresistance effect element according to the present invention.
Figure 2:
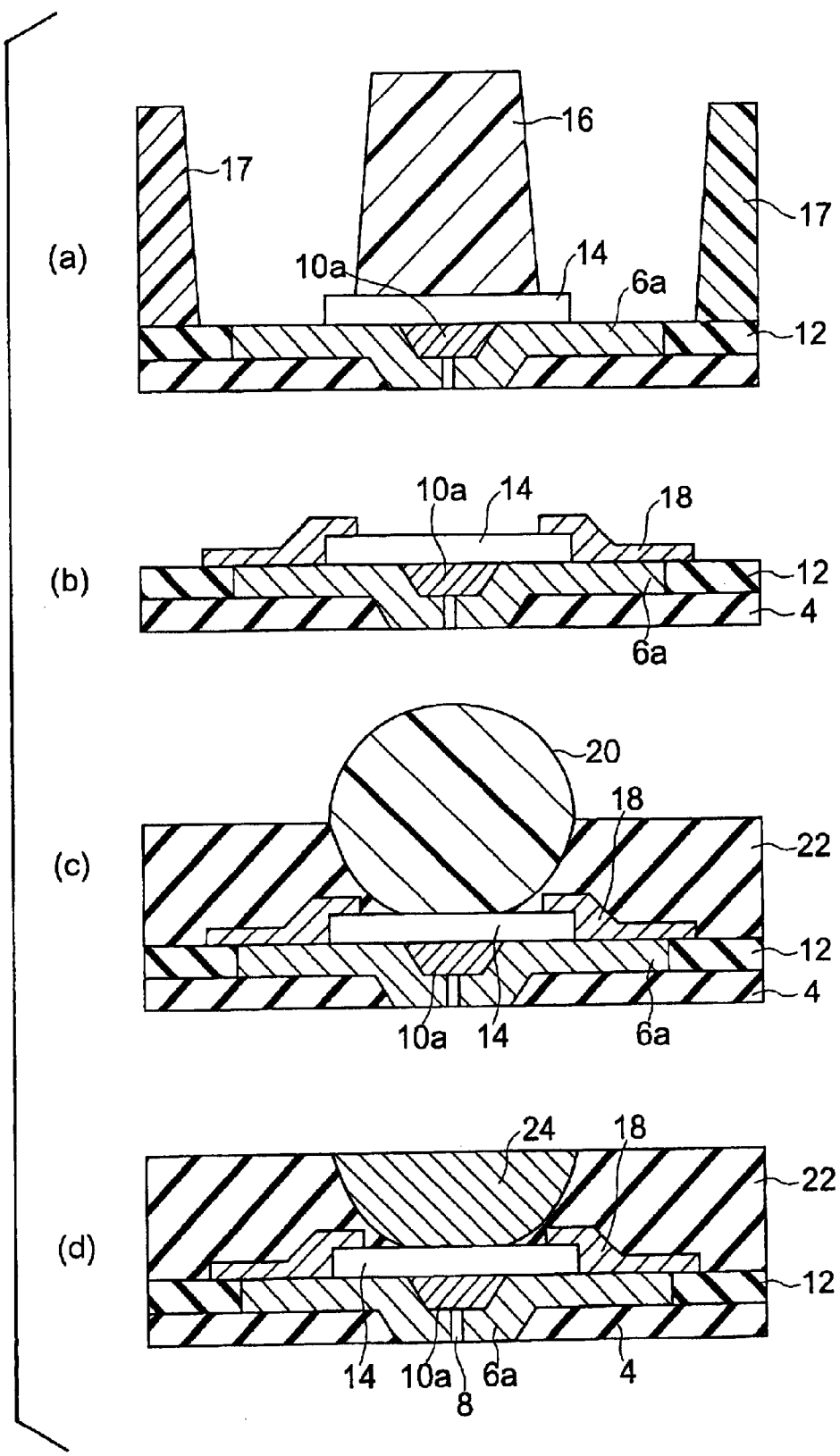
FIGS. 2(a) through 2(d) are sectional views showing producing steps in the first embodiment of a method for producing a magnetoresistance effect element according to the present invention.

Referring to FIGS. 1 and 2, the first embodiment of a method for producing a magnetoresistance effect element according to the present invention will be described below. FIGS. 1 and 2 are sectional views showing producing steps in the first embodiment.

First, as shown in FIG. 1($a$), an insulating film 4 having a thickness of 50 nm to 500 nm is formed on a substrate 2. In this case, the insulating film 4 may be formed of an oxide, such as $SiO_2$ or $Al_2O_3$, a nitride, such as $Si_3N_4$ or AlN, or an oxide nitride which is a mixture thereof, and may be formed by a usual sputtering method or CVD (Chemical Vapor Deposition) method. In this embodiment, the insulating film 4 of $SiO_2$ having a thickness of 100 nm was formed by the RF (Radio Frequency) magnetron sputtering method, by using a target of Si, by the reactive sputtering and by feeding oxygen. Subsequently, in order to form a groove for a reproducing yoke, a resist pattern (not shown) having an aperture width of 50 nm to 500 nm is prepared by a usual lithography technique, and a tapered groove is prepared in the insulating film 4. Then, the resist is removed (see FIG. 1($a$)). In this embodiment, after a resist pattern (not shown) having an aperture width of 400 nm was formed by an I-line stepper, etching was carried out by the RIE (Reactive Ion Etching) using $CHF_3$ as an etching gas at a making power of 150 W at a pressure of 2 Pa, a reproducing yoke forming groove having a tapered angle of about 80 degrees was formed in the insulating film 4. In this case, the etching method may be any one of the ICP (Inductivity Coupled Plasma) method, the IBE (Ion Beam Etching) method and the RIBE (Reactive Ion Beam Etching) method in addition to the RIE method used in this embodiment, and should not particularly be limited.

Then, as shown in FIG. 1($a$), when a reproducing magnetic yoke material film 6 is formed on the whole surface of the substrate, the reproducing magnetic yoke material film 6 on the groove is recessed to form a recessed portion 7. In this case, the material of the reproducing magnetic yoke should not particularly be limited. The material of the reproducing magnetic yoke may be a material which is a magnetically soft material having a relatively large magnetic permeability and a small anisotropy, e.g., a microcrystal ferroalloy which has magnetically soft characteristics and which is selected from an Ni—Fe alloy, such as $Ni_{80}Fe_{20}$ [at %] (commonly called Permalloy), an FeAlSi (commonly called Sendust) or FeZr(Ta)N alloy, and an Fe—Cu—M—Si—B alloy (commonly called Finemet, and M is any one of Ta, Nb, Mo, W, Zr and Hf). As a layer underlying the reproducing magnetic yoke, an diamagnetic material (e.g., PtMn, PdMn, PtPdMn) or the like may be formed in order to form a single magnetic domain and stabilize the magnetic anisotropy. In addition, the forming method should not particularly be limited. The forming method may be any one of usual methods, such as the RF magnetron sputtering method, the ion beam sputtering method, the MBE (Molecular Beam Epitaxy) method and the CVD method, if it can form a film having a small number of defects in the reproducing magnetic yoke forming groove. More preferably, in order to improve the magnetic characteristics of the reproducing magnetic yoke, the film may be deposited by applying a magnetic field and raising the temperature of the substrate. In this embodiment, the reproducing magnetic yoke material film 6 of Permalloy having a thickness of 100 nm was deposited by the IBS (Ion Beam Sputter) method with Ar ion beams under a pressure of $1 \times 10^{-4}$ Torr while applying a magnetic field into the plane of the film. After a buried state of the reproducing magnetic yoke material film 6 of Permalloy formed in the groove was verified on its cross section by a transmission electron microscope, it was verified that the reproducing magnetic yoke material film 6 had little defect. In addition, after the magnetic characteristics of the reproducing magnetic yoke material film 6 were measured by a B-H loop tracer, it was verified that the reproducing magnetic yoke material film 6 has good magnetically soft characteristics that the coercive force was 1 Oe or less and the anisotropic magnetic field was 5 Oe.

Then, as shown in FIG. 1($b$), a lithography technique, e.g., the IBE (Ion Beam Etching) method, is used for patterning the reproducing magnetic yoke material film 6 to form a reproducing magnetic yoke 6$a$. Thereafter, a reproducing magnetic gap 8 is formed in the reproducing magnetic yoke 6$a$ by the FIB (Focused Ion Beam) method or the like. Furthermore, in FIG. 1($b$) and the subsequent figures, the substrate 2 is omitted. Alternatively, the reproducing magnetic gap 8 may be formed after depositing the reproducing magnetic yoke material film 6, and thereafter, the reproducing magnetic yoke material film 6 may be patterned to prepare the reproducing magnetic yoke 6$a$. The reproducing magnetic gap 8 may be prepared by another method, such as the RIE method or the RIBE method. In this embodiment, the reproducing magnetic gap 8 was formed by the FIB method so as to have a width of 50 nm. Then, a bottom electrode forming resist pattern (not shown) is formed so that a region including the recessed portion 7 on the reproducing magnetic yoke 6$a$ is an opening portion. Subsequently, a film of, e.g., Cu, is deposited on the whole surface so as to have a thickness of about 100 nm, and thereafter, the resist pattern is removed to form a bottom electrode forming film 10 of Cu (see FIG. 1($b$)). Thereafter, an insulating film 12 is formed on the whole surface. In this embodiment, an Al2O3 film having a thickness of 200 nm was used as the insulating film 12. As the insulating material, an oxide, such as $SiO_2$ or $(Si, Al)O_x$, may be used. Then, the insulating film 12 and the bottom electrode forming film 10 are polished and flattened by, e.g., the CMP (Chemical Mechanical Polishing), until the film surface of the reproducing magnetic yoke 6a is exposed, so that a bottom electrode 10a buried in the recessed portion 7 of the reproducing magnetic yoke 6a is formed as shown in FIG. 1(c). After the surface flattened by the CMP was measured by an AFM (Atomic Force Microscope), it was verified that the surface had a surface roughness of 10 nm or less and good surface performance.

Then, as shown in FIG. 2(a), after a CPP type magnetoresistance effect material film is formed on the whole surface of the substrate, a CPP type magnetoresistance effect film forming resist pattern 16 is formed by lithography in a region which covers the bottom region 10a on the CPP type magnetoresistance effect material film. The resist pattern 16 used in this embodiment has a width of 0.8 $\mu$m and a resist thickness of 0.9 $\mu$m. The resist pattern 16 is used as a mask for etching the CPP type magnetoresistance effect material film until the reproducing magnetic yoke 6a is exposed, so that a CPP magnetoresistance effect film 14 is formed in a region which covers the bottom electrode 10a. Subsequently, the remaining resist pattern 16 is etched by, e.g., the isotropic etching, so that the resist pattern 16 on the CPP magnetoresistance effect film 14 has a width of 0.6 $\mu$m and a resist thickness of 0.7 $\mu$m (see FIG. 2(a)). Thereafter, a magnetization fixing film forming resist pattern 17 is formed on the insulating film 12.

Then, after a magnetization fixing material film of CoPt alloy having a thickness of 50 nm is formed on the whole surface by a usual spattering method, the CPP type magnetoresistance effect forming resist pattern 16 and the magnetization fixing film forming resist pattern 17 are removed to obtain a magnetization fixing film 18 which overlaps with a part of the top face of the CPP type magnetoresistance effect film 14 as shown in FIG. 2(b).

Then, a surface treatment is carried out so that the exposed surface of the CPP type magnetoresistance effect film 14 is hydrophilic. As this treatment method, a plasma treatment or a chemical treatment is used. This hydrophilic treatment is carried out so that the surface of the magnetization fixing film 18 is water repellent (hydrophobic). Then, after an self-condensing organic resist 20 is applied on the whole surface of the substrate as shown in FIG. 2(c), temperature is raised from 100° C. to 200° C. to cause the self-condensing organic resist 20 to self-condense on the CPP type magnetoresistance effect film 14 to be droplets. Furthermore, the self-condensing organic resists include a polystyrene-polymethylmethacrylate and a polybutadiene-polystyrene. Subsequently, after an insulating film 22 of, e.g., $Al_2O_3$, having a thickness of 1 $\mu$m is formed on the whole surface by, e.g., the sputtering method or the CVD method, the droplet-like organic resist 20 is removed, so that a groove for forming a curved electrode is formed in the insulating film 22. Then, an electrode film of, e.g., Cu, is formed in the groove to carry out a flattening treatment to form a top electrode 24, which has a shape converging toward the CPP type magnetoresistance effect film 14, on the CPP type magnetoresistance effect film 14 as shown in FIG. 2(d). Thereafter, the substrate 2 (not shown) is peeled off to obtain a current perpendicular to the plane type thin-film magnetic head. Furthermore, the method for forming the insulating film 22 may be a depositing method by which the droplet-like organic resist 20 is not deformed by heat or the like.

As described above, according to the producing method in this embodiment, the electrode 24 formed on the CPP type magnetoresistance effect film 14 has a shape converging toward the CPP type magnetoresistance effect film 14, so that the distance between the top and bottom electrodes 10a and 24 increasing as approaching the magnetization fixing film 18. Thus, even if a large current is caused to flow between the bottom electrode 10a and the top electrode 24, it is possible to prevent the direction of magnetization of the magnetization fixing film from being disturbed by the magnetic field due to the current, and it is possible to decrease the dispersion in direction of magnetization of the CPP type magnetoresistance effect film 14. In addition, it is possible to decrease the leakage current from the corner portions of the electrodes 10a and 24 to cause a large sense current to flow between the electrodes 10a and 24, and it is possible to obtain a high reproducing output.

(Second Embodiment)

Figure 3:
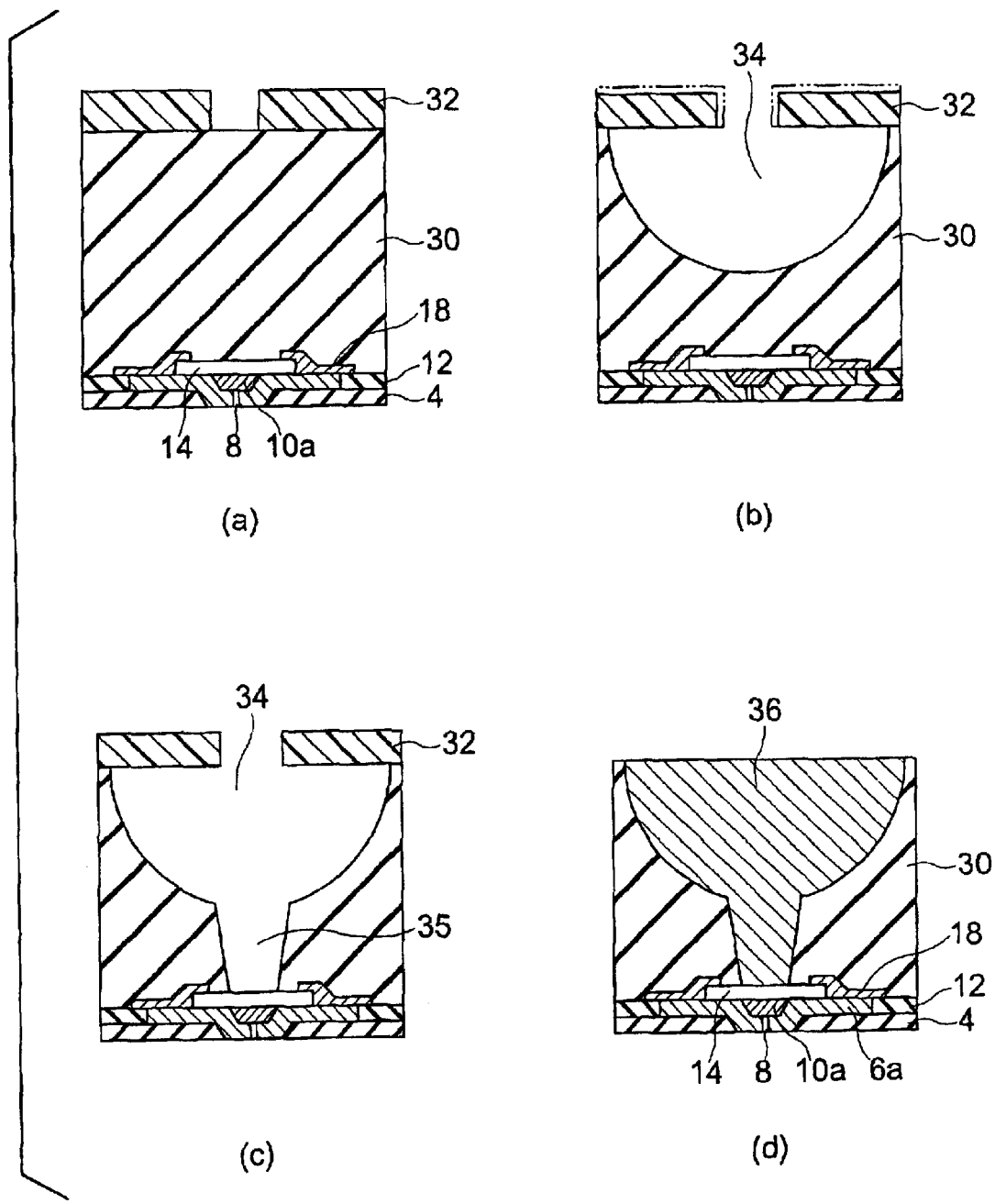
FIGS. 3(a) through 3(d) are sectional views showing producing steps in the second embodiment of a method for producing a magnetoresistance effect element according to the present invention.

Referring to FIG. 3, the second embodiment of a method for producing a magnetoresistance effect element according to the present invention will be described below. FIGS. 3(a) through 3(d) are sectional views showing producing steps in the second embodiment.

In the producing method in this second embodiment, a magnetization forming film 18 is formed so as to overlap with a part of a CPP type magnetoresistance effect film 14 by the same method as that in the first embodiment.

Subsequently, in FIG. 3(a), an insulating film 30 is formed on the whole surface of the substrate. In this case, the insulating film 30 of $SiO_2$ having a thickness of 2 $\mu$m was formed by the reactive sputtering method. The material of the insulating film 30 may be another material, and should not particularly be limited. Thereafter, as shown in FIG. 3(a), a resist pattern 32 which has an opening portion having a width of about 0.3 $\mu$m in a region on the insulating film 30 corresponding to the position of a reproducing magnetic gap 8 and which has a thickness of 0.3 $\mu$m is formed. That is, the resist pattern 32 has an opening portion, the position of which matches with that of the CPP type magnetoresistance effect film 14.

Then, as shown in FIG. 3(b), the resist pattern 32 is used as a mask for etching the insulating film 30 by an isotropic etching, such as the CDE (Chemical Dry Etching), to form a curved recessed portion 34 in the insulating film 30. Subsequently, as shown in FIG. 3(c), the resist pattern 30 is used as a mask for further etching the insulating film 30 by the anisotropic etching until the surface of the CPP type magnetoresistance effect film 14 is exposed, so that an opening portion 35 communicated with the CPP type magnetoresistance effect film 14 is formed in the insulating film 30. In this embodiment, the isotropic etching was carried out by a depth of about 1 $\mu$m at a pressure of 70 Pa using $CF_4$ gas and CDE. By this etching, the resist thickness of the resist pattern 32 was decreased by about 0.05 $\mu$m (see FIG. 3(b)). Then, the resist pattern 32 having a resist thickness of 0.25 $\mu$m was used as a mask for anisotropic-etching the insulating film 30 of $SiO_2$ in a depth direction by about 0.4 $\mu$m by the RIE method at a pressure of 1 Pa using a gas kind of $CHF_3$. Thus, as shown in FIG. 3(c), electrode forming contact holes 34 and 35 having a curved shape and a converging shape are formed in the insulating film 30.

Then, after the resist pattern 32 is removed, an electrode material, e.g., Cu, is buried in the contact holes 34 and 35 and flattened as shown in FIG. 3(d), so that a current perpendicular to the plane type thin-film magnetic head having a top electrode 36 having a shape which is curved and converges toward the CPP type magnetoresistance effect film 14 is obtained on the CPP type magnetoresistance effect film 14. In this embodiment, Cu was used as the material of the top electrode 36. As the material of this electrode, other materials than Cu may be used.

According to this producing method in the second embodiment, the top electrode 36 formed on the CPP type magnetoresistance effect film 14 has a shape which is curved and converges toward the CPP type magnetoresistance effect film 14, so that the distance between the top and bottom electrodes 10a and 36 increases as approaching the magnetization fixing film 18. Thus, even if a large current is caused to flow between the bottom electrode 10a and the top electrode 36, it is possible to prevent the direction of magnetization of the magnetization fixing film from being disturbed by the magnetic field due to the current, and it is possible to decrease the dispersion in direction of magnetization of the CPP type magnetoresistance effect film 14. In addition, it is possible to decrease the leakage current from the corner portions of the electrodes 10a and 36 to cause a large sense current to flow between the electrodes 10a and 36, and it is possible to obtain a large reproducing output.

In this second embodiment, the positioning precision between the CPP type magnetoresistance effect film 14 and the top electrode 36 can be improved as compared with that in the first embodiment.

Furthermore, in the producing method in the second embodiment, the curved recessed portion 34 is formed in the insulating film 30 by the isotropic etching, and thereafter, the converging opening portion 35 communicated with the CPP type magnetoresistance effect film 14 is formed by the anisotropic etching. However, curved or converging opening portions 34 and 35 communicated with the CPP type magnetoresistance effect film 14 may be formed in the insulating film 30 only by the isotropic etching by adjusting the thickness of the insulating film 30 and etching conditions.

Figure 4:
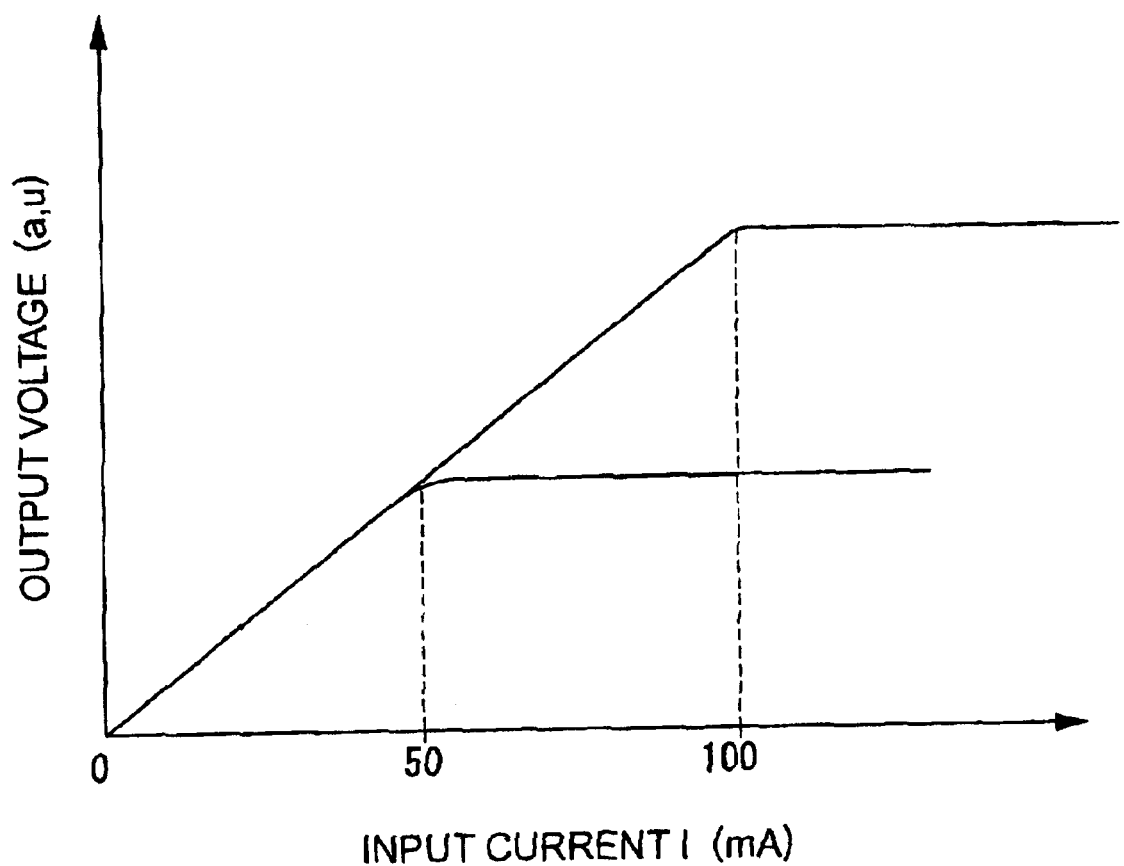
FIG. 4 is a graph showing a reproducing output to a making current in a thin-film magnetic head, which uses a magnetoresistance effect element produced by a embodiment of a producing method according to the present invention, and in a conventional thin-film magnetic head.

When a current was caused to flow between electrodes with respect to a current perpendicular to the plane type thin-film magnetic head using a magnetoresistance effect element wherein the top electrode thus obtained on the CPP type magnetoresistance effect film 14 had a shape which converges toward the CPP type magnetoresistance effect film 14 and which was produced in the first and second embodiment, and a conventional current perpendicular to the plane type thin-film magnetic head shown in FIG. 6, reproducing outputs (output voltages) corresponding to the magnetoresistance effect were measured. The results thereof are shown in FIG. 4. As shown in FIG. 4, the output voltage of the conventional thin-film magnetic head is saturated when the current is about 50 mA, whereas the output voltage of the thin-film magnetic head using the magnetoresistance effect element in this embodiment does not tend to be saturated until the current reaches about 100 mA. Thus, it can be clearly seen that the structure of the thin-film magnetic head using the magnetoresistance effect element produced according to the present invention is also very effective from the standpoint of the reduction of the magnetic field due to leakage current.

(Third Embodiment)

Figure 8:
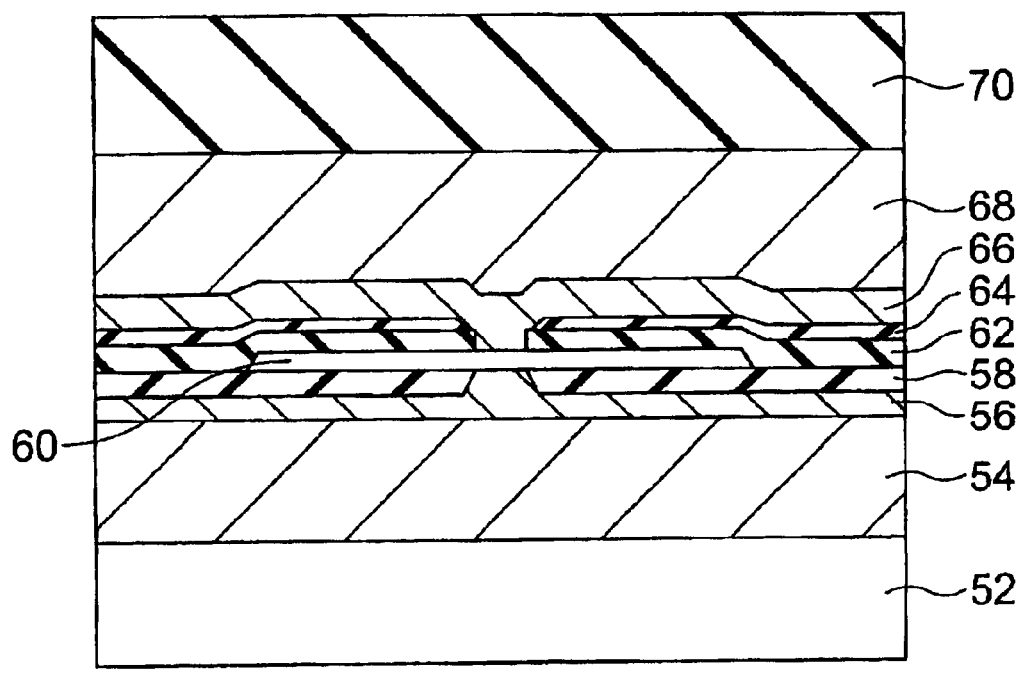
FIG. 8 is a sectional view showing the construction of the third embodiment of a magnetoresistance effect element according to the present invention.

FIG. 8 shows the construction of the third embodiment of a magnetoresistance effect element according to the present invention. The magnetoresistance effect element in this third embodiment comprises: a magnetic shield film 54 which is formed on a substrate 52; a bottom electrode film 56 which is formed on the magnetic shield film 54 and which has a top face having a substantially flat protruding portion; an insulating film 58 which is formed on a recessed portion of the bottom electrode 56 and which has the same surface as the top face of the bottom electrode 56; a CPP type magnetoresistance effect film 60 which is formed so as to cover the top face of the bottom electrode 56; a magnetization fixing layer (not shown) which is provided outside of the magnetoresistance effect film 60; an insulating film 62 which is formed so as to cover the magnetoresistance effect film 60 and which has a first tapered opening portion on the protruding portion of the bottom electrode 56; an insulating film 64 which is formed on the insulating film 62, the insulating film having a second opening portion which is arranged at a position corresponding to the first opening portion and which converges upwards as leaving the center of the first opening portion in a direction parallel to the film plane of the magnetoresistance effect film 60; a top electrode 66 which is formed so as to be filled in the opening portions of the insulating films 64 and 62; a magnetic shield film 68 which is formed on the top electrode 66; and a protective film 70 which is formed on the magnetic shield film 68.

That is, in the magnetoresistance effect element in this embodiment, the shapes of the bottom electrode 56 and top electrode 66 on their cross sections perpendicular to the film plane of the magnetoresistance effect film 60 converge toward the magnetoresistance effect film 60.

If the shapes of the bottom electrode 56 and top electrode 66 on their cross sections perpendicular to the film plane of the magnetoresistance effect film 60 are formed so as to converge toward the magnetoresistance effect film 60 as the magnetoresistance effect element in this embodiment, it is possible to decrease the leakage current from the edge portions of the bottom electrode 56 and top electrode 66. As a result, it is possible to cause a large sense current to flow through the magnetoresistance effect film 60 to increase the variation in resistance of the magnetoresistance effect film 60, so that it is possible to obtain a high reproducing output and improve the withstand voltage. In addition, even if a large current is caused to flow between the top electrode 66 and the bottom electrode 56, it is possible to prevent the direction of magnetization of the magnetization fixing film from being disturbed by the magnetic field due to the current.

Figure 9:
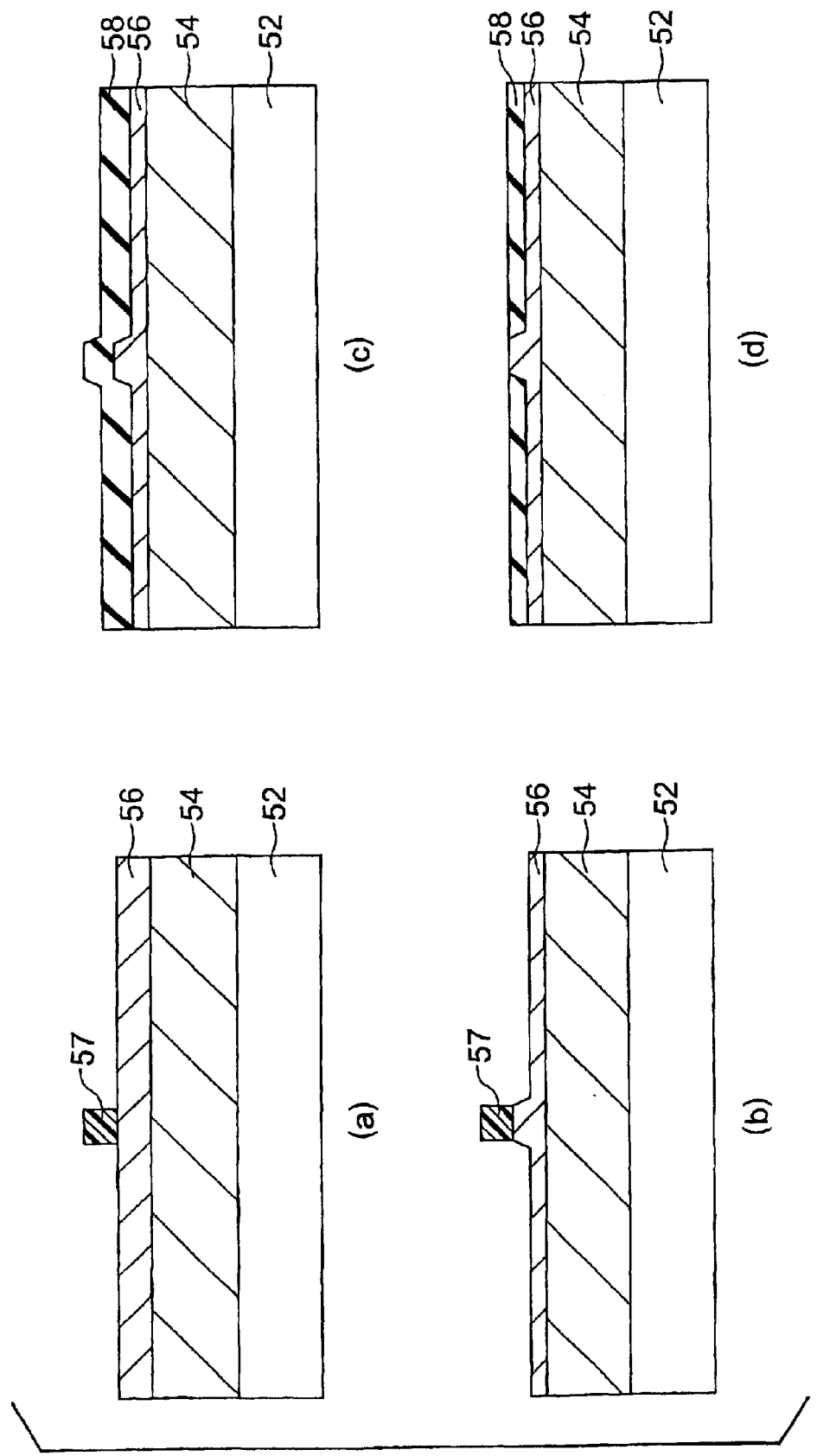
FIGS. 9($a$) through 9($d$) are sectional views showing steps of producing the third embodiment of a magnetoresistance effect element according to the present invention.
Figure 10:
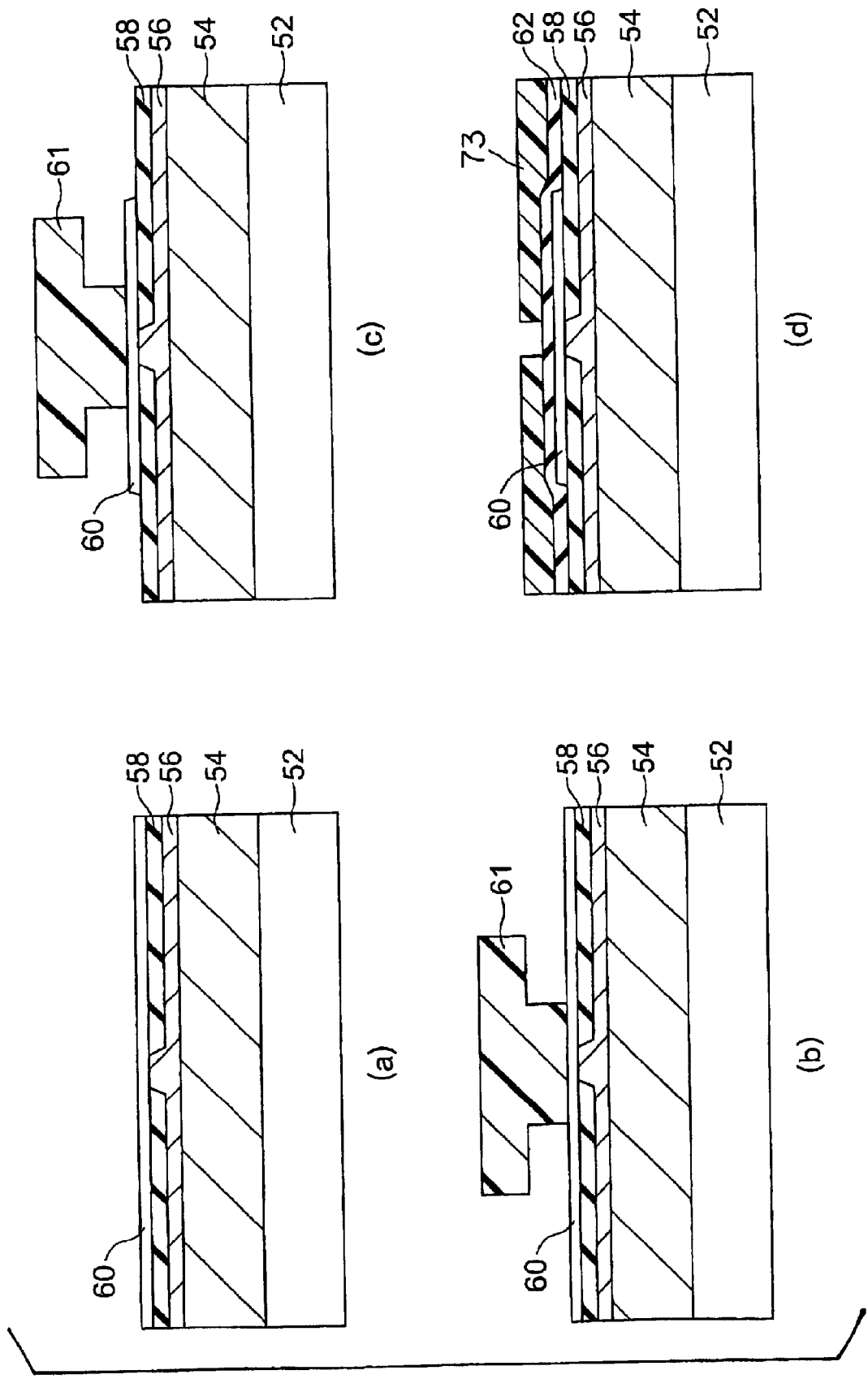
FIGS. 10($a$) through 10($d$) are sectional views showing steps of producing the third embodiment of a magnetoresistance effect element according to the present invention.
Figure 11:
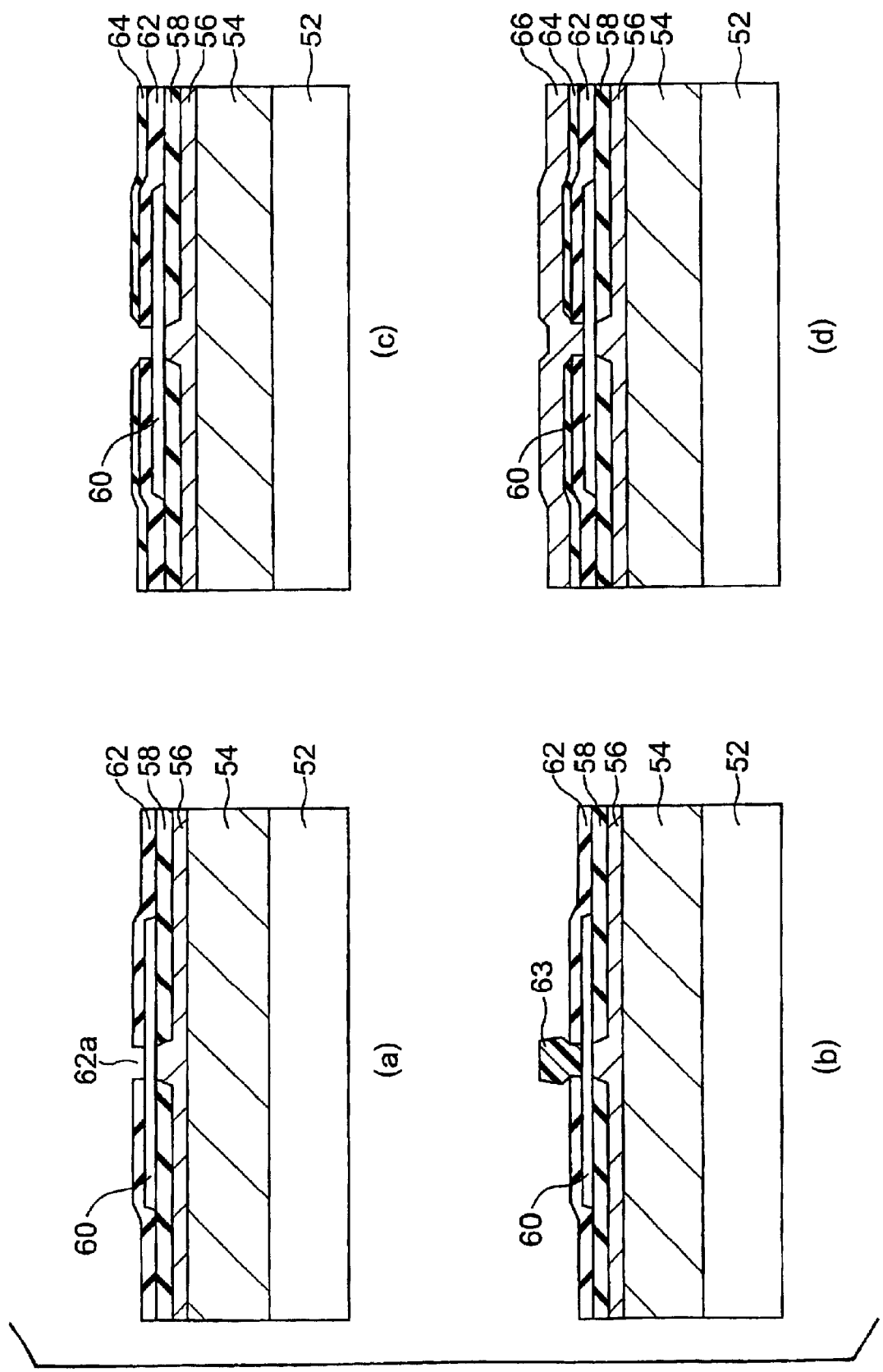
FIGS. 11($a$) through 11($d$) are sectional views showing steps of producing the third embodiment of a magnetoresistance effect element according to the present invention.

Referring to FIGS. 9 through 11, a method for producing the third embodiment of a magnetoresistance effect element according to the present invention will be described below.

First, after a magnetic shield 54 of, e.g., $Ni_{80}Fe_{20}$, having a thickness of 300 nm is formed on a substrate 52, a bottom electrode 56 of a copper thin film having a thickness of 100 nm is formed by a usual sputtering method (see FIG. 9(a)).

Then, after an electron beam exposing resist having a thickness of 100 nm was applied to the bottom electrode 56, a predetermined remaining pattern 57 (a diameter of 100 nm in this embodiment) was formed with electron beams by exposure and development (see FIG. 9(a)). Subsequently, after the substrate was irradiated with Ar ions at an incident angle of about 20 degrees to carry out etching, the resist 57 was removed to form a bottom electrode 56 having a protruding portion having a height of about 50 nm (see FIG. 9(b)).

Then, after an aluminum oxide ($Al_2O_3$) film 58 having a thickness of about 100 nm was formed on the whole surface by the sputtering method (see FIG. 9(c)), it was etched back to be flattened by the CMP or the like (see FIG. 9(d)). As a result, the irregularities on the protruding portion of the bottom electrode 56 and on the surface of the aluminum oxide film 58 were 10 nm or less, so that surface performance was good.

After a signal extracting pad (not shown) and so forth are formed on the substrate thus flattened, a magnetoresistance effect film 60 is deposited (see FIG. 10(a)). The magnetoresistance effect film has a construction of 5 nm Ta/10 nm PtMn/3 nm CoFe/3 nm Cu/2 nm CoFe/5 nm Ta from the bottom electrode 56.

Thereafter, an I-line exposure system and a two-layer resist (T shape) are used for forming a resist pattern 61 having a size of about 500 nm×500 nm on the magnetoresistance effect film 60 (see FIG. 10(b)). Subsequently, this resist pattern is used as a mask for etching the magnetoresistance effect film 60 with Ar ions to form the magnetoresistance effect film 60 (see FIG. 10(c)). Then, after a CoPt film having a thickness of 20 nm is deposited as a magnetization fixing layer (not shown), the resist pattern 61 is removed to form a magnetization fixing layer.

Then, after a silicon oxide ($SiO_2$) film 62 having a thickness of 30 nm is deposited by the reactive sputtering method, an electron beam exposing resist having a thickness of 100 nm is applied, and a predetermined extracting pattern 73 ($\phi$100 nm in this embodiment) is formed with electron beams by exposure and development (see FIG. 10(d)). By patterning the silicon oxide film 62 by the RIE method, a contact hole 62a for forming a top electrode 66 is obtained (see FIG. 11(a)). Then, after a self-condensing organic matter 63 was applied on the substrate having the contact hole 62a, baking (30 minutes at 200° C.) was carried out to cause the self-condensing organic matter 63 to be droplets on the contact hole 62a (see FIG. 11(b)). In this case, since the wettability of the silicon oxide film 62 is different from that of Ta of the outermost surface layer of the magnetoresistance effect film 60, it is not particularly required to carry out any hydrophilic treatments.

Then, after a silicon oxide ($SiO_2$) film 64 having a thickness of 20 nm is deposited by the reactive sputtering method on the contact hole on which the organic matter has been self-condensed, the self-condensed organic matter 63 is removed (see FIG. 11(c)). Thereafter, a copper film was deposited by a usual sputtering method so as to have a thickness of 100 nm, and an electrode patterning was carried out to form a top electrode 66 (see FIG. 11(d)).

Then, as shown in FIG. 8, after a magnetic shield 68 of, e.g., $Ni_{80}Fe_{20}$, having a thickness of 300 nm was formed as a top magnetic shield layer, signal extracting portions of the bottom electrode 56 and top electrode 66 were formed, and thereafter, an aluminum oxide film 70 having a thickness of 20 $\mu$m was deposited as a protective film.

Finally, after bar working and chip working were carried out to examine the outputs of heads, it was found that a head in this embodiment having the bottom and top electrodes 56 and 66 converging toward the magnetoresistance effect film 60 has a higher withstand voltage by about 30% than that of a head which does not converge, and can obtain a high output voltage with a low current.

As described above, according to a method for producing a magnetoresistance effect element according to the present invention, it is possible to cause a large sense current to flow between electrodes, and it is possible to decrease the dispersion in direction of magnetization of a CPP element based on a magnetic current due to the current and increase a reproducing output.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a magnetoresistance effect element comprising:

after forming a first electrode, forming a magnetoresistance effect film on the first electrode;

forming an insulating film on the magnetoresistance effect film;

isotropic-etching the insulating film to form a curved recessed portion in the insulating film by using a mask having an opening portion, the position of which matches with the position of the magnetoresistance effect film;

etching the insulating film to expose the top surface of the magnetoresistance effect film; and forming a second electrode in the recessed portion.

2. A method for producing a magnetoresistance effect element as set forth in claim 1, wherein:

the step of etching the insulating film to expose the top surface comprises forming a converging opening portion, which is communicated with the magnetoresistance effect film, in the insulating film by an anisotropic etching, and the step of forming the second electrode film comprises filling the converging opening portion and the curved recessed portion with an electrode material film.

3. A method for producing a magnetoresistance effect element as set forth in claim 1, further comprising after forming the magnetoresistance effect film, forming a magnetization forming film that overlaps with a part of the top surface of the magnetoresistance effect film.

4. A method for producing a magnetoresistance effect element as set forth in claim 1, wherein the insulating film is formed by reactive sputtering.

5. A method for producing a magnetoresistance effect element as set forth in claim 1, wherein the isotropic etching comprises chemical dry etching.

6. A method for producing a magnetoresistance effect element as set forth in claim 2, wherein the anisotropic etching comprises reactive ion etching.

7. A method for producing a magnetoresistance effect element as set forth in claim 2, wherein the second electrode has a shape that is curved and converges toward the magnetoresistance effect film.

8. A method for producing a magnetoresistance effect element as set forth in claim 2, wherein the magnetoresistance effect film comprises a film configured to be substantially perpendicular a current applied to the element.

9. A method for producing a magentoresistance effect element as set forth in claim 1, wherein the mask comprises a resist pattern.

10. A method for producing a magnetoresistance effect element as set forth in claim 1, wherein:

the step of etching the insulating film to expose the top surface comprises forming a converging opening portion, which is communicated with the magnetoresistance effect film, in the insulating film by an isotropic etching, and the step of forming the second electrode film comprises filling the converging opening portion and the curved recessed portion with an electrode material film.

* * * * *